US005975997A

United States Patent [19]
Minami

[11] Patent Number: 5,975,997
[45] Date of Patent: Nov. 2, 1999

[54] METHOD OF DOUBLE-SIDE LAPPING A WAFER AND AN APPARATUS THEREFOR

[75] Inventor: Hideaki Minami, Annaka, Japan

[73] Assignee: Super Silicon Crystal Research Institute Corp., Annaka, Japan

[21] Appl. No.: 08/977,715

[22] Filed: Nov. 25, 1997

[30] Foreign Application Priority Data

Jul. 7, 1997 [JP] Japan .................................. 9-180881

[51] Int. Cl.⁶ ........................................................ B24B 5/00
[52] U.S. Cl. .......................... 451/287; 451/41; 451/262; 451/268; 451/63
[58] Field of Search .................................. 451/41, 60, 63, 451/287, 288, 262, 268

[56] References Cited

U.S. PATENT DOCUMENTS

| | | | |
|---|---|---|---|
| 4,393,628 | 7/1983 | Ottman et al. .............................. | 451/63 |
| 5,800,253 | 9/1998 | Ikemoto .................................... | 451/63 |

FOREIGN PATENT DOCUMENTS 52-12956  4/1977  Japan .
56-189    1/1981  Japan .

OTHER PUBLICATIONS

IBM Technical Disclosure Bulletin—Disk substrate Polisher by Fox et al., Aug. 1983.

*Primary Examiner*—David A. Scherbel
*Assistant Examiner*—George Nguyen
*Attorney, Agent, or Firm*—Armstrong, Westerman, Hattori, McLeland & Naughton

[57] ABSTRACT

A pair of ring-shaped lapping plates 13, 23 are faced to both surfaces of a wafer 1. Each lapping plate 13, 23 has an outer diameter approximately equal to a radius of the wafer 1 and a lapping surface 14, 24 sliding in contact with the wafer 1. Each lapping plate 13, 23 is rotated along a direction reverse from the other, while an abrasion slurry A is fed into cavities 15, 25 of the lapping plates 13, 23 and discharged together with dusts separated from the wafer 1 through grooves engraved in the lapping surfaces 14, 24 and gaps between the wafer 1 and the lapping surfaces 14, 24. The lapping plate 23 is carried toward the stationary lapping plate 13 at a rate corresponding to abrasion of the lapping surfaces 14, 24. During lapping, the wafer 1 is rotated by drive rollers 31 and supported by guide rollers 32. In this way, both surfaces of the wafer 1 are simultaneously lapped.

2 Claims, 4 Drawing Sheets

METHOD OF DOUBLE-SIDE LAPPING A WAFER AND AN APPARATUS THEREFOR

BACKGROUND OF THE INVENTION

The present invention relates to a method of lapping both surfaces of a wafer to eliminate defects such as irregular shape and work damages, and an apparatus therefor. The present invention is particularly suitable for processing a large wafer.

A single crystal ingot manufactured by CZ or FZ method is cut into blocks having a predetermined shape, ground at the periphery and then set in a slicer. In the slicer, the crystal block is sliced in to wafers having a predetermined thickness by a high-speed rotating blade.

A slicing blade is representatively an inner diameter saw prepared by cutting a thin stainless steel sheet to a doughnut shape and depositing a Ni plating layer in which diamond abrasives are embedded on an inner edge of the shaped stainless steel sheet.

A wafer obtained by slicing a crystal ingot is likely to deviate in thickness and flatness due to various conditions such as a tension applied to a blade, an adhering state of diamond abrasives onto an inner edge of the blade and dimensional accuracy of a rotation axis of a slicer. If slicing conditions are not appropriate, a work damaged layer which extends from the surface is deeply developed into the inner part of the sliced wafer.

These unfavorable deviations resulting from slicing are eliminated by lapping a sliced wafer.

In a conventional lapping method, a plurality of wafers 1 are set in carriers 2 and located on a lower lapping plate 3, in the manner such that the wafers 1 are uniformly distributed on the lower lapping plate 3, as shown in FIGS. 1(a) and 1(b). An upper lapping plate 4 is brought down into contact with the wafers 1, abrasives are fed into a gap between the lower lapping plate 3 and the upper lapping plate 4, and the wafers 1 are rotated and revolved. During rotation and revolution, the wafers 1 are ground with the abrasives. A commonly used slurry is prepared by suspending $Al_2O_3$ or SiC grains as abrasives having a particle size of approximately 10 μm in a proper amount of water.

Various methods have been proposed so far, to facilitate setting of wafers in such a lapping machine. For instance, wafers are sucked to an upper lapping plate and then located on a lower lapping plate at proper positions, as disclosed in Japanese Patent Publication 56-189.

Recently, semiconductor wafers are becoming larger and larger in size, in order to enhance the productivity of electronic devices. In this regard, there is a strong demand for enlargement of a lapping machine to a scale suitable for lapping large wafers or for provision of another type of lapping machine which can lap such large wafers.

If large wafers are lapped by such a conventional lapping machine as shown in FIGS. 1(a) and 1(b), it is necessary to use lapping plates having a radius larger than a diameter of wafers. Consequently, the lapping machine as a whole would be very large in size, various problems on weight, size, operatability etc. would result and automatic operation or control would be extremely difficult.

In addition, a difference in the linear velocity between outer and inner parts of lapping plates increases in proportion to a diameter of lapping plates. The velocity difference causes uneven abrasion of the lapping plates, so that the surface of lapped wafers lacks uniformity.

A lapping machine suitable for lapping a large wafer is proposed in Japanese Patent Publication 52-12956. The proposed lapping machine has a pair of disc-shaped or ring-shaped lapping plates which are pressed onto both surfaces of a wafer. While the lapping plates pressed onto the wafer are rotated, a slurry in which abrasive grains are suspended is supplied downwards to the wafer between the lapping plates at the top of the lapping plates.

However, the abrasive slurry is not sufficiently carried to gaps between the lapping plates and the wafer, since the abrasive slurry is fed from the outside of the lapping plates. The abrasive slurry is not effectively used for lapping the wafer, and only a small amount of the abrasive slurry is carried to the inside of the lapping plates.

For instance, in the case using ring-shaped lapping plates having cavities at their central parts, a downward flow of the abrasive slurry can not be restricted at a lower part of the lapping plate opposite to a slurry supply position. Consequently, a lack of abrasives results at the lower parts of the lapping plates. Although the lack of abrasives could be avoided by increasing the rotation speed of the wafer, the wafer such as a semiconductor wafer does not have mechanical strength sufficiently resistant to such a high speed rotation.

The present invention is accomplished to overcome these problems.

The first object of the present invention is to provide a lapping machine suitable for easily lapping or polishing both surfaces of a wafer, even one which has a large diameter, to a smooth state with high lapping efficiency, and without enlarging the scale of the lapping machine.

The second object of the present invention is to increase the ratio of an abrasive slurry which is effectively consumed for lapping a wafer.

The third object of the present invention is to promote discharge of silicon dusts, which are separated from both surfaces of a wafer being lapped, through ring-shaped lapping plates having contact planes narrow in width.

SUMMARY OF THE INVENTION

According to the present invention, a pair of ring-shaped lapping plates, which have lapping surfaces held in contact with both surfaces of a wafer and an outer diameter approximately equal to a radius of the wafer, are pressed onto surfaces of the wafer from its center to its periphery from both sides of the wafer. Each ringshaped lapping plate is rotated along a direction opposite the other, while a slurry in which abrasives are suspended is fed into a cavity of each lapping plate. The abrasive slurry is carried to the surfaces of the wafer through grooves engraved in the lapping surfaces. A used slurry is discharged together with dusts separated from the wafer through the grooves and the lapping surfaces.

One of the ring-shaped lapping plates is provided as a stationary plate, and the other lapping plate is provided as a movable plate. The movable plate is preferably carried toward the stationary plate at a rate corresponding to abrasion of the lapping surfaces, so as to press the wafer with a pressure uniformly distributed over the surfaces of the wafer held in contact with the lapping surfaces. During lapping, the wafer is supported at its edge by guide rollers and rotated by drive rollers.

A lapping apparatus according to the present invention comprises a stationary lapping means, a movable lapping means and a means for rotatably supporting a wafer.

The stationary lapping means has a rotatable ring-shaped lapping means plate at the top of a stationary shaft having a through hole for feeding an abrasive slurry. The movable lapping has a rotatable ring-shaped lapping plate at the top of a movable shaft having a through hole for feeding the same abrasive slurry. Each of the lapping plates has a lapping surface at the side facing to the wafer, and radial grooves extending from the inside to the outside of the lapping surface are engraved in the lapping surface.

The supporting means has drive rollers which come in contact with both surfaces of the wafer and apply a driving force for rotation of the wafer and guide rollers which support the wafer at a predetermined position during rotation.

The other features of the present invention will be apparent from the following explanation consulting with the drawings.

PREFERRED EMBODIMENT OF THE INVENTION

Figure 2:
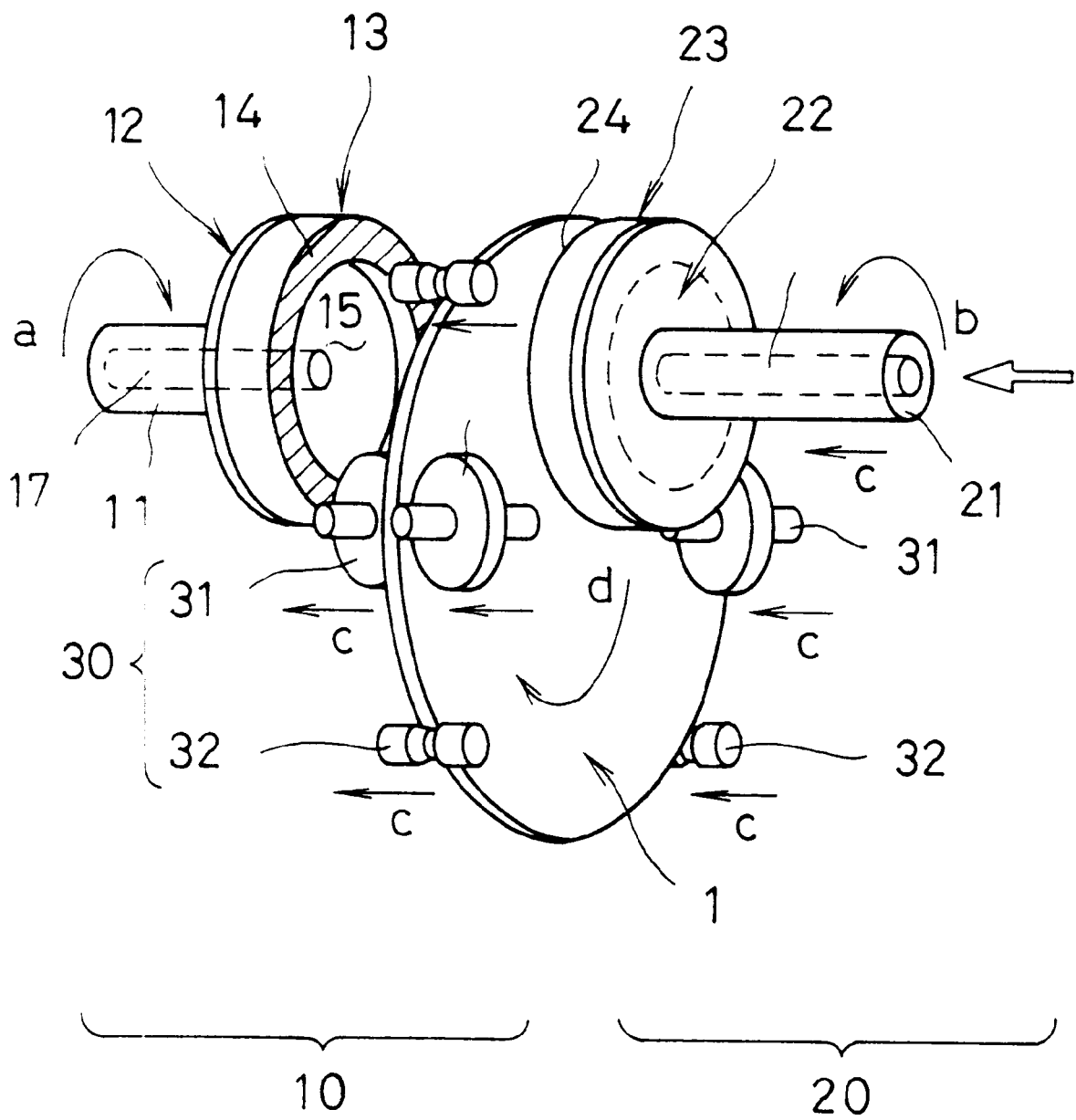
FIG. 2 is a view illustrating a double-side lapping machine according to the present invention.

In a double-side lapping apparatus according to the present invention, a stationary lapping means 10 and a movable lapping means 20 are faced together along a horizontal or vertical direction, and a wafer 1 to be lapped is located between the lapping means 10 and 20, as shown in FIG. 2.

The stationary lapping means 10 has a flexible disc 12 attached to the top or end of a stationary shaft 11. A ring-shaped lapping plate 13 is fixed to the flexible disc 12. The stationary lapping plate 13 is rotated along a direction shown by the arrow a by a driving force transmitted to the stationary shaft 11.

The movable lapping means 20 has a flexible disc 22 attached to the top of a movable shaft 21. A ring-shaped lapping plate 23 is fixed to the flexible disc 22 and rotated along a direction shown by the arrow b by a driving force transmitted to the movable shaft 21. The ring-shaped lapping plate 23 has the same surface area as that of the stationary lapping plate 13.

Since the lapping plates 13 and 23 are rotated along directions opposite to each other, a pressure given by the lapping plate 13 is made equal to a pressure given by the other lapping plate 23. Consequently, the same friction force is applied onto each surface of the wafer 1. In addition, a torque applied to one surface of the wafer 1 is neutralized with a torque applied to the opposite surface, so that the wafer 1 is pressed between the lapping surfaces 14, 24 of the lapping plates 13, 23.

The ring-shaped lapping plate 23 of the movable lapping means 20 is carried along a direction shown by the arrow c by a pressure supplied from a pressure control means (shown in FIG. 4, but explained later), so as to compensate for abrasion of the lapping surfaces 14, 24. A pressure applied to the wafer 1 is kept constant due to the controlled movement of the lapping surface 24.

The supporting means 30 has drive rollers 31, 31 provided at positions in contact with both surfaces of the wafer 1. The drive rollers 31, 31 apply a driving force to the wafer 1, to rotate the wafer 1 along a direction shown by the arrow d. The position of the wafer 1 is stabilized by guide rollers 32 which rotates in contact with an edge of the wafer 1.

Since the wafer 1 is pressed between the ring-shaped lapping plates 13 and 23 at the predetermined position relationship as abovementioned, both surfaces of the wafer 1 are lapped under predetermined conditions. During lapping, the position of the wafer 1 is stabilized due to application of a rotation torque to the wafer 1 by rotation of the drive rollers 31, 31 in contact with both surfaces of the wafer 1. The drive roller 31 at the movable side is preferably carried toward the wafer 1 at a rate corresponding to abrasion of the lapping surfaces 14, 24, so that the drive roller 31 is pressed onto the surface of the wafer 1 at a constant pressure.

Each of the ring-shaped lapping plates 13, 23 preferably has an outer diameter approximately equal to a radius of the wafer 1 to make a pressure uniform over the whole surface of the lapping surface 14 or 24. The lapping surfaces 14, 24 have a ring shape with a narrow width, and cavities 15, 25 are provided inside the lapping surfaces 14, 24.

A lapping rate is usually increased in response to a pressure and a linear velocity. The linear velocity is proportional to a distance from the center of the lapping plate 13 or 23.

If a wafer is lapped using lapping plates which do not have cavities or which have a broad ring shape, the lapping surfaces are unevenly abraded due to the variation of the linear velocity. The uneven abrasion of the lapping surfaces deteriorates flatness of a lapped wafer.

The lapping plates 13, 23 according to the present invention have the ring-shaped lapping surfaces 14, 24 with a narrow width. Due to the ring shape with a narrow width, the liner velocity at the inner regions is closely akin to the linear velocity at the outer regions. Therefore, the lapping surfaces 14, 24 apply substantially the same lapping force to the wafer 1, so as to uniformly lap the wafer 1.

Figure 3:
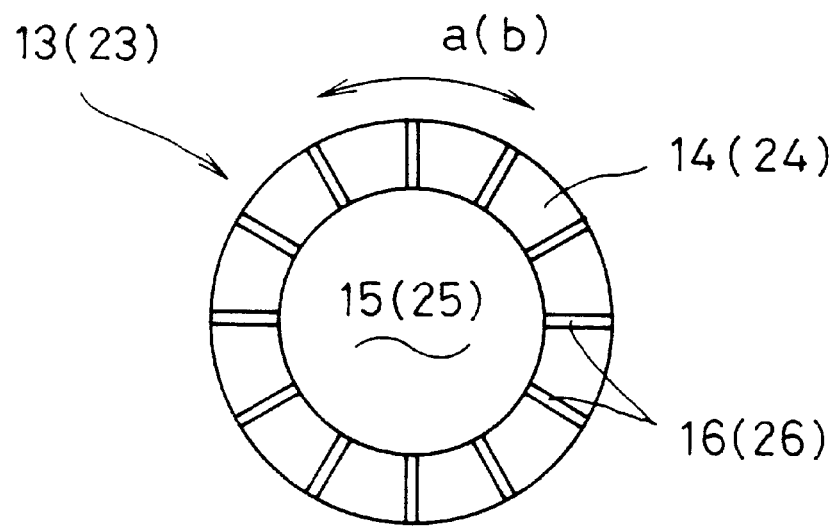
FIG. 3 is a schematic view illustrating a lapping surface of a ring-shaped lapping plate.

Grooves 16, 26 are engraved in the lapping surfaces 14, 24 with a pattern shown in FIG. 3 for instance.

A slurry A in which abrasive grains are suspended is fed through holes 17, 27 drilled in the shafts 11, 21 into the cavities 15, 25 of the lapping plates 13, 23. The abrasive slurry A is then supplied to both surfaces of the wafer 1. The abrasive slurry A used for lapping the wafer is discharged together with dusts separated from the wafer 1 through the grooves 16, 26 and gaps between the wafer 1 and the lapping surfaces 14, 24 to the outside. The discharge of the used abrasive slurry A together with the dusts is promoted by a centrifugal force derived from rotation of the ring-shaped lapping plates 13, 23.

In this way, the abrasive slurry A is supplied to both surfaces of the wafer 1 through the cavities 15, 25 of the ring-shaped lapping plates 13, 23. The lapping plates 13, 23 apply the same pressure onto both surfaces of the wafer 1 via the supplied abrasive grains. Consequently, the wafer 1 is lapped to the same degree at the both surfaces. At this time, the abrasive slurry A used for lapping is discharged through the grooves 16, 26 and the gaps between the wafer 1 and the lapping surfaces 14, 24, so that the abrasive slurry A can be efficiently used for lapping without wasteful consumption.

The lapping surfaces 14, 24 may be coated with a proper layer as occasion demands. For instance, a lapping surface 14, 24 covered with a polishing cloth may be used for mirror-polishing the wafer 1. The finish grade of the lapped wafer 1 can be adjusted by the kind and particle size of abrasive grains.

The ring-shaped lapping plates 13, 23 are also effective for suppressing the influence of thermal deformation. If a conventional full flat lapping plate is used, thermal deformation of the lapping plate is increased in proportion to the square of a radius of the lapping plate as well as to the difference in a temperature between front and back sides of the lapping plate. For instance, the lapping plate designed for lapping a large wafer is likely to be deformed even by a tiny work heat, so that it is difficult to lap such a large wafer with high accuracy.

The lapping plate according to the present invention has a ring shape such that the flatness of the lapping surface is hardly deteriorated due to a work heat. Influence of the work heat itself is also suppressed due to rigidity of the ring shape, even when the lapping plate is rotated at a high speed. Furthermore, deformation of the lapping surface caused by pressure variation in the full flat lapping plate can be avoided by using the ring-shaped lapping plate. These advantages enable precise lapping especially for large wafers.

$Al_2O_3$, SiC or diamond grains of #1200 to #4000 in particle size are used as abrasives. The wafer can be mirror-polished using extremely fine abrasives. When an alkali or the like is used as a liquid for suspending abrasive grains, the wafer can be simultaneously lapped and etched.

In performance of lapping, the wafer 1 is located between the lapping surface 14 of the stationary lapping plate 13 and the lapping surface 24 of the movable lapping plate 23, in the manner such that the lapping surfaces 14, 24 are held in contact with both surfaces of the wafer 1 at parts from the center to the periphery of the wafer. The lapping plates 13, 23 are pressed onto the wafer I at a pressure of 150 g/cm$^2$ or so. While the abrasive slurry A is fed through the holes 17, 27 to the cavities 15, 25 of the lapping plates 13, 23, the ring-shaped plates 13 and 23 are rotated in opposite directions a and b, respectively, and the wafer 1 is rotated along the direction d. In this way, both surfaces of the wafer 1 are simultaneously lapped by the lapping surfaces 14, 24.

The lapping surfaces 14, 24 are abraded in the progress of lapping. The movable lapping means 20 and the wafer supporting means 30 are automatically carried along the direction c by a pressure control means. Consequently, both surfaces of the wafer 1 are uniformly lapped under stable conditions, without fluctuation in the state of the lapping surfaces 14, 24 pressed onto the wafer 1.

Figure 4:
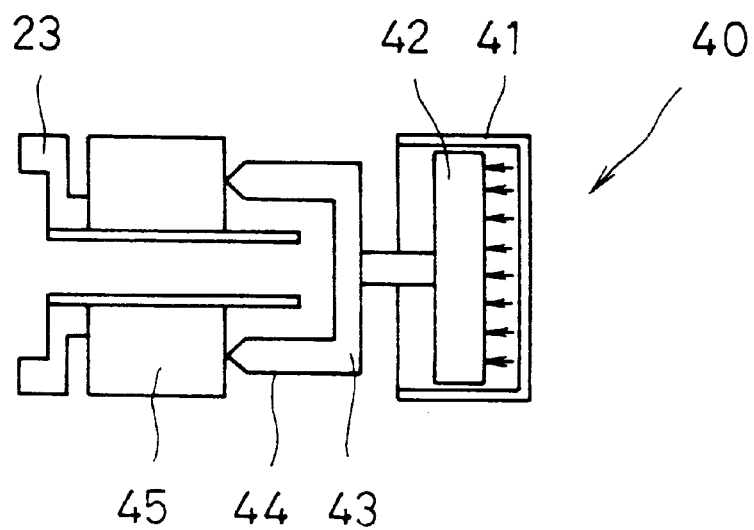
FIG. 4 is a schematic view illustrating a bearing means for rotatably supporting a shaft of a movable lapping plate.

The pressure control means may be one shown in FIG. 4. This pressure control means 40 has a piston 42 which is received in a pressurized chamber 41 and is connected to a head 43 whose legs 44 are pressed onto a shaft bearing 45.

Figure 5:
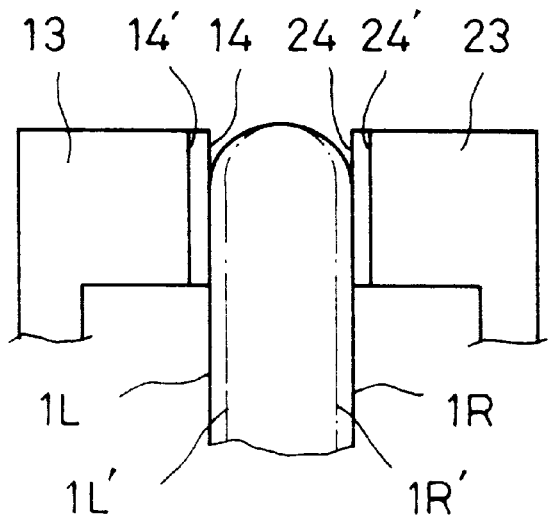
FIG. 5 is a sectional view for explaining the positional relationship of a wafer with lapping surfaces in response to thickness reduction of the wafer.
Figure 6:
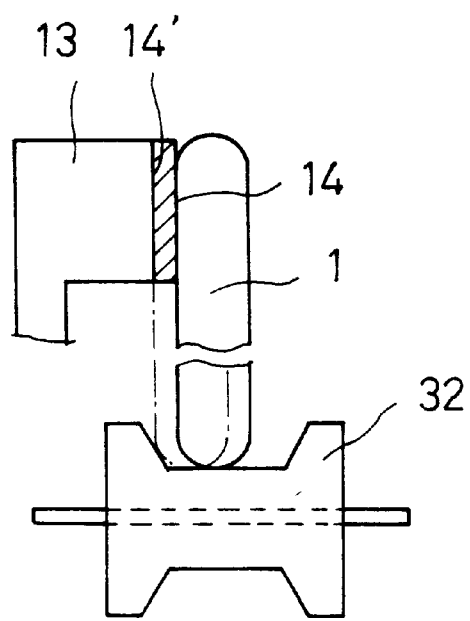
FIG. 6 is a sectional view for explaining position control of a guide roller in response to thickness reduction of a wafer.

Movements of the lapping surfaces from a position 14 to 14' and from a position 24 to 24' (as shown in FIGS. 5 and 6) in response to abrasion of the lapping surfaces are in a very short distance every time, so that the surfaces of the wafer 1 facing to the lapping surfaces 14, 24 also shift in a very short distance. In this sense, even when the guide rollers 32 are manually set at proper positions, the wafer 1 can be held at a predetermined position only by pressing the wafer 1 between the lapping plates 13, 23 without necessity of shift control of the guide rollers 32.

The movable lapping plate 23 is shifted a distance of 60–100 μm corresponding to thickness reduction of the wafer 1 (represented by 1R to 1R' and 1L to 1L' in FIG. 5) plus α. The shift of the lapping plate 23 is performed by movement of the shaft bearing 45 which is pressed by the piston 42.

Figure 1A:
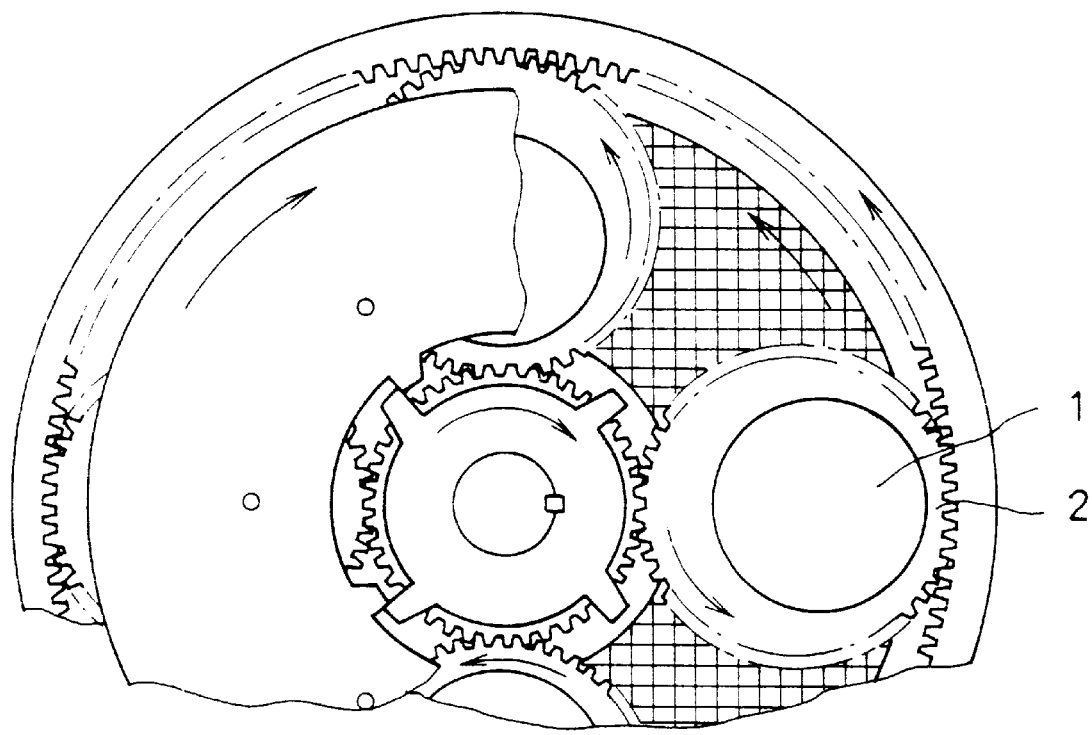
FIG. 1(a) is a plan view illustrating a conventional double-side lapping machine.
Figure 1B:
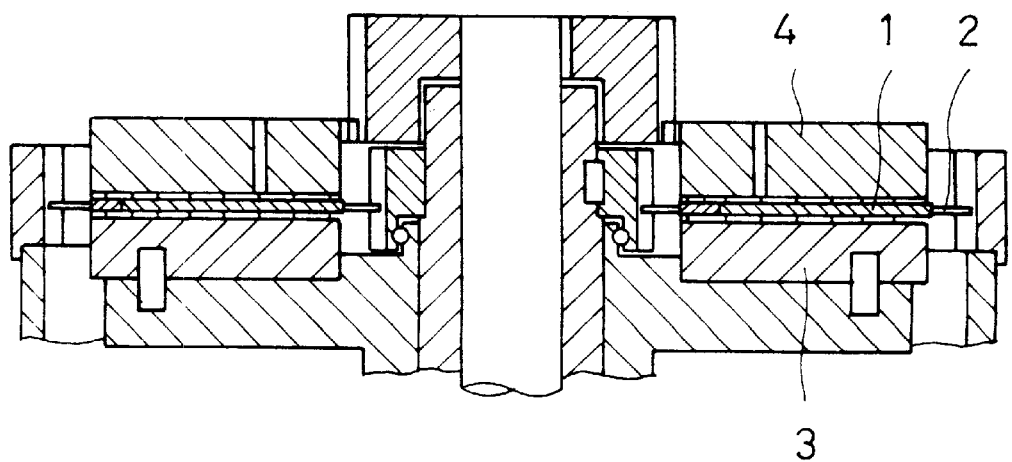
FIG. 1(b) is a sectional view illustrating said conventional double-side lapping machine.

In the method according to the present invention, both surfaces of the wafer 1 are simultaneously lapped by the lapping surfaces 14, 24 each having an outer diameter approximately equal to the radius of the wafer 1. Therefore, this method does not necessarily need large lapping plates even for lapping a large wafer, as compared with the conventional lapping method explained in FIGS. 1(*a*) and 1(*b*). Consequently, the enlargement of the lapping machine in scale can be avoided.

The ring-shaped lapping plates 13, 23 are so rigid that flatness of the planes defined by the lapping plates 13, 23 is not damaged by abrasion. Therefore, the lapping plates 13, 23 can be continuously used for a long time without dressing. although a conventional full flat lapping plate shall be periodically dressed due to abrasion.

Since the wafer 1 is lapped under stabilized conditions during lapping, such defects as plane faults and work damages incorporated during a slicing step are effectively removed from the wafer. Consequently, a high-grade lapped wafer excellent in surface condition is obtained.

In the case where the lapping plates 13, 23 are rotated at a high speed and pressed onto the wafer 1 with a big difference in velocity from rotation of the wafer 1, gaps between the wafer 1 and the lapping plates 13, 23 become great due to fluidity of the abrasive slurry A, to apply chemical reaction to the wafer 1. In this consequence, the wafer 1 can be subjected to mechanical lapping and chemical polishing at the same time by properly selecting lapping conditions. Of course, mechanical polishing can be performed by rotating the lapping plates 13, 23 at a low speed with a low pressure onto the wafer 1 so as to suppress chemical reaction.

EXAMPLE

Both surfaces of a wafer 1 of 200 mm in diameter were lapped with ring-shaped lapping plates 13, 23 of 103 mm in outer diameter and 83 in inner diameter. The lapping plates 13, 23 were faced to and pressed onto both surfaces of the wafer 1 at a pressure of 200 g/cm$^2$.

An abrasive slurry A was prepared by suspending $Al_2O_3$ grains having a mean particle size of 13 μm in water at a ratio of 400 g/l.

The abrasive slurry A was fed through holes 17, 27 into cavities 15, 25 of the lapping plates 13, 23 at a flow rate of 0.005 m$^3$/min, the lapping plates 13, 23 were rotated at 500 r.p.m. along the directions a and b, respectively, and the wafer 1 was rotated at 20 r.p.m. along the direction d. During lapping, the pressure of the lapping plates 13, 23 to the wafer 1 was measured and controlled according to a predetermined sequential program.

After the wafer 1 was lapped for 3 minutes, the wafer 1 was taken out of the lapping machine. Both surfaces of the lapped wafer 1 were observed. It was noted that total thickness variation (TTV) of the lapped wafer 1 was 1 μm, while TTV of the wafer 1 before being lapped was 30 μm. Saw marks detected on the wafer 1 before being lapped were completely removed from both surfaces of the lapped wafer 1.

According to the present invention as abovementioned, ring-shaped lapping plates having a diameter approximately equal to a radius of a wafer to be lapped are pressed onto both surfaces of the wafer, and an abrasive slurry is fed into cavities of the lapping plates, so as to simultaneously lap both surfaces of the wafer. Since the specified lapping plates are used for lapping the wafer, a lapping machine large in scale is not necessary even for lapping a large wafer. In addition, automatic operation of the lapping machine can be facilitated, since it is easy to control movement of a movable lapping means and a wafer supporting means as well as rotation of the ring-shaped lapping plates. The wafer lapped in this way is excellent in dimensional accuracy, and work damage is uniformly removed from the wafer.

What is claimed is:

1. An apparatus for double-side lapping a wafer, comprising:

a stationary lapping means having a ring-shaped first lapping plate rotatably provided at an end of a stationary shaft having a first through hole for feeding an abrasive slurry, said first lapping plate having a first lapping surface arranged to face a first surface of a wafer, grooves extending from the inside to the outside of said first lapping plate being radially engraved in said first lapping surface;

a movable lapping means having a ring-shaped second lapping plate rotatably provided at an end of a movable shaft having a second through hole for feeding an abrasive slurry, said second lapping plate having a second lapping surface facing said first lapping surface of said first lapping plate so that said second lapping surface is arranged to face a second surface of said wafer, grooves extending from the inside to the outside of said second lapping plate being radially engraved in said second lapping surface; and a wafer rotatably supporting means having drive rollers held in contact with said first surface and said second surface of said wafer for rotating said wafer and guide rollers held in contact with an edge of said wafer for controlling a rotating position of said wafer.

2. The double-side lapping apparatus defined in claim 1, wherein;

the movable lapping means and the wafer rotatably supporting means are coupled to a pressure control means for carrying said movable lapping means and said wafer rotatably supporting means toward the stationary lapping means at a rate corresponding to abrasion of the lapping surfaces.

* * * * *